(12) United States Patent  
Egle et al.

(10) Patent No.: US 7,483,223 B2  
(45) Date of Patent: Jan. 27, 2009

(54) OPTICAL COMPONENT HAVING AN IMPROVED TRANSIENT THERMAL BEHAVIOR AND METHOD FOR IMPROVING THE TRANSIENT THERMAL BEHAVIOR OF AN OPTICAL COMPONENT

(75) Inventors: Wilhelm Egle, Aalen (DE); Wolfgang Hafner, Koenigsbronn (DE); Willi Anderl, Huettlingen (DE); Ulrich Bingel, Lauterburg (DE); Holger Muenz, Aalen-Wasseralfingen (DE); Thomas Neidhardt, Heidenheim (DE)

(73) Assignee: Carl Zeiss SMT AG (DE)

( * ) Notice: Subject to any disclaimer, the term of this patent is extended or adjusted under 35 U.S.C. 154(b) by 218 days.

(21) Appl. No.: 11/245,288

(22) Filed: Oct. 6, 2005

(65) Prior Publication Data

US 2006/0093253 A1 May 4, 2006

Related U.S. Application Data

(63) Continuation-in-part of application No. PCT/EP2005/004861, filed on May 4, 2005.

(60) Provisional application No. 60/616,464, filed on Oct. 6, 2004, provisional application No. 60/568,547, filed on May 6, 2004.

(51) Int. Cl.  
    *G02B 7/02* (2006.01)
(52) U.S. Cl. .................................................. 359/820
(58) Field of Classification Search ................ 359/512, 359/820  
See application file for complete search history.

(56) References Cited

U.S. PATENT DOCUMENTS

| 6,104,554 | A | * | 8/2000 | Bodurek et al. | ............. | 359/820 |
| 6,144,504 | A | | 11/2000 | Sudoh et al. | ................ | 359/811 |
| 6,359,678 | B1 | * | 3/2002 | Ota | .............................. | 355/53 |
| 2002/0113954 | A1 | | 8/2002 | Antoni et al. | ................. | 355/53 |
| 2003/0169520 | A1 | | 9/2003 | Goldstein | ................... | 359/845 |
| 2003/0235682 | A1 | | 12/2003 | Sogard | ..................... | 428/195.1 |
| 2004/0035570 | A1 | | 2/2004 | Hara | .......................... | 165/289 |
| 2004/0051984 | A1 | | 3/2004 | Oshino et al. | ............... | 359/845 |

FOREIGN PATENT DOCUMENTS

| DE | 100 45 265 | 3/2002 |
| DE | 101 38 313 | 7/2002 |
| DE | 101 38 284 | 2/2003 |
| EP | 0 532 236 | 9/1992 |

(Continued)

OTHER PUBLICATIONS

International Search Report; Apr. 6, 2006; 3 pages.

*Primary Examiner*—Joseph Martinez  
(74) *Attorney, Agent, or Firm*—St. Onge Steward Johnston & Reens LLC (57) ABSTRACT

An optical component comprises at least one optically effective optical element which heats up when irradiated with light, and at least one holding element for the at least one optical element for holding the at least one optical element in a carrier structure, wherein the at least one optical element is connected to the at least one holding element in heat conducting fashion, and wherein the at least one holding element is at least partially provided with an active cooling system for carrying off heat from the at least one optical element. Additionally or alternatively, a temperature control device is provided which controls the temperature of at least a part of the mount of the optical element.

20 Claims, 10 Drawing Sheets

FOREIGN PATENT DOCUMENTS

| | | |
|---|---|---|
| EP | 1 318 424 | 6/2003 |
| EP | 1 387 054 | 2/2004 |
| EP | 1 394 612 | 3/2004 |
| JP | 0 630 8294 | 11/1994 |
| JP | 2004095993 | 3/2004 |
| WO | WO 02/065482 | 8/2002 |

* cited by examiner

OPTICAL COMPONENT HAVING AN IMPROVED TRANSIENT THERMAL BEHAVIOR AND METHOD FOR IMPROVING THE TRANSIENT THERMAL BEHAVIOR OF AN OPTICAL COMPONENT

CROSS-REFERENCE TO RELATED APPLICATIONS

The present application is a continuation-in-part of pending International patent application PCT/EP2005/004861 filed on May 4, 2005 which designates the United States and which claims priority of U.S. provisional patent application with Ser. No. 60/568,547 filed on May 6, 2004. Further, the present application claims priority of U.S. provisional patent application 60/616,464 filed on Oct. 6, 2004.

BACKGROUND OF THE INVENTION

The invention generally relates to improvements of the thermal behavior of an optical component. More specifically, the invention relates to improvements of the thermal behavior of a collector for use in EUV-lithography.

Although the present invention will be particularly described with respect to a collector for use in EUV-lithography, the present invention is not limited thereto.

It is to be understood that, in general, the invention is also useful for other optical components.

Simulation results for the collector of an illuminating system in the extreme ultraviolet (EUV) range show that the collector strongly heats up in operation. As a consequence of the temperature rise, the collector deforms.

Figure 1:
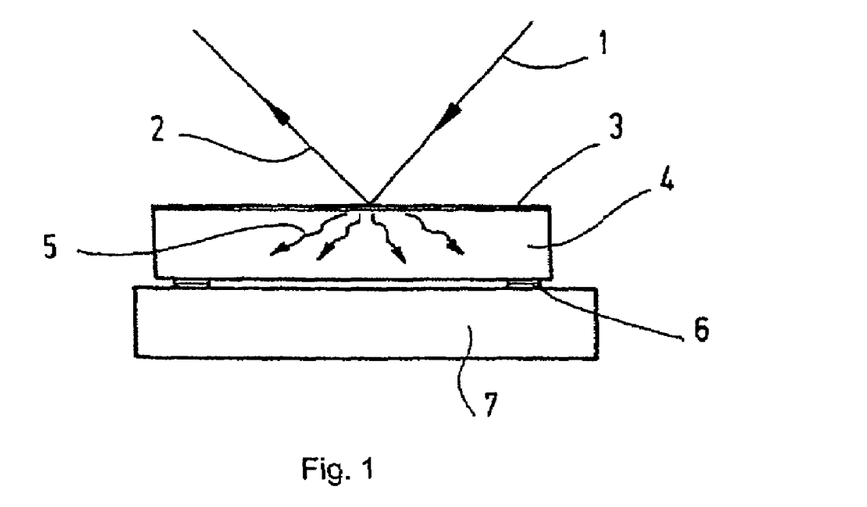
FIG. 1a shows a general embodiment for explaining the principle of the present invention.

With reference to FIG. 1 of the accompanying drawings, the heating of a general optical component will be briefly explained. FIG. 1 shows an incident optical beam 1 impinging on an optical component. The optical component is, for example, a mirror, comprising a substrate body 4 and an optical layer 3 as the optical element, at which the beam is deviated or reflected as shown by reference numeral 2. Other optical components like lenses, prisms, gratings, beam splitters, etc., are conceivable.

A portion of the impinging energy 1 is absorbed by the optical layer 3 or by the substrate 4. Heat 5 is generated thereby which spreads in the substrate 4. In most cases, this heat is poorly carried off, because the fixing element 6 to the holder 7 and also the substrate material 4 have a poor heat conduction ability. The substrate 4 expands, while this expansion is hindered by the fixing elements 6 and the holder 7, which leads to local deformations of the optical element (substrate and/or optical layer) and, thus, to a deterioration of the optical performance of the device, in which the optical component is used.

Depending on the power of the illumination of the optical system, certain temperatures of the system arise. If no heat carrying off is provided by heat conduction into a cooling medium, the temperatures can become pretty high and rapidly exceed an operating temperature which is in some cases required.

EP 1 387 054 A2 discloses a cooling apparatus and a cooling method for cooling an optical element provided in a vacuum atmosphere. The cooling apparatus includes a radiational cooling part, arranged apart from the optical component for cooling the optical component by radiation heat transfer, and a controller for controlling the temperature of the radiation cooling part.

This cooling apparatus is expensive, because it requires a considerable number of additional parts, thus also increasing the space requirements of the optical component.

US 2004/0051984 A1 discloses devices and methods for cooling devices, optical elements and optical systems, including optical systems used in vacuum environments. The cooling device comprises a heat-receiving plate arranged proximally to a respective optical component along a surface of the optical component at which light directed to the optical component is not incident or outgoing. The heat-receiving plate is configured to receive heat from the optical component. Again, this known device requires a number of parts in addition to the parts of the optical component for cooling same.

The technical problems occurring as a result of the heating of the optical element can be summarized as follows. On the one hand, the optical component becomes too hot, as a result of which the substrate material and the optical layers can be destroyed. On the other hand, the optical component can be deformed so severely that the optical performance of the system does not conform to the required specification. Finally, the deformation of the optical component can change during operation, that is represent a transient effect. A one-off or static correction of the resultant error in the optical system, for example with the aid of other optical components, would therefore be inadequate.

SUMMARY OF THE INVENTION

It is an object of the present invention to provide another cooling concept for an optical component which is less expensive on the one hand, and on the other hand is nevertheless effective in avoiding or at least reducing deteriorations due to heating effects of the optical component and, thus, of the optical system, in which the optical component is used.

It is another object of the present invention to provide an optical component which, on the basis of an optimization of this thermal behavior, contributes to allowing deterioration of the optical performance of the optical element during operation at least to be reduced.

A further object of the present invention is to provide an optical component which is improved with regard to its transient thermal behavior, so that transient effects that are caused by the heating of the optical component and disturb the optical performance of the optical element, primarily defocusing and/or illumination in the far field, can at least be reduced.

It is a further object of the present invention to provide methods for optimizing the thermal behavior of an optical component.

According to an aspect of the invention, an optical component according to the present invention is provided, comprising at least one optically effective optical element which heats up when irradiated with light, and at least one holding element for the at least one optical element for holding the at least one optical element in a carrier structure, wherein the at least one optical element is connected to the at least one holding element in heat conducting fashion, and wherein the at least one holding element is at least partially provided with an active cooling system for carrying off heat from the at least one optical element.

The concept of this aspect of the present invention provides to carry off the heat from the at least one optical element of the optical component by means of heat conduction into the at least one holding element which connects the at least one optical element with the carrying structure of the optical component. Thus, the elements of the optical component which are already present are used for the heat carrying off from the at least one optical element so that no or at least not a large number of additional parts are required for this purpose.

According to a further aspect of the invention, in the case of an optical component which has at least one optical element, which heats up during operation due to irradiation with light, and at least one mount for the at least one optical element, the mount is assigned a temperature control device which controls the temperature $T_F$ at least of part of the mount to a temperature $T_{F,opt}$ at which a heating-induced expansion of the optical element during operation results in the least deformation of the optical element.

According to a further aspect of the invention, in the case of an optical component which has at least one optical element, which heats up during operation due to irradiation by light, and at least one mount for the at least one optical element, the optical element is assigned a temperature control device which controls the temperature T at least of part of the optical element to a temperature $T_o$ which corresponds at least approximately to the operating temperature of the optical element during optical operation, so that the temperature of the optical element does not change substantially during operation.

The two aforementioned aspects can be used both on their own and in combination with each other, which is particularly preferred, to improve the thermal behavior of the optical component to the extent that inevitable heating of the optical element and accompanying expansion of the optical element do not result in a deformation, or result in the least deformation, that can impair the optical performance of the optical element.

The aspect mentioned first of the two afore-mentioned aspects is based on the idea that, when setting an optimum temperature $T_{F,opt}$ of the mount, the mount of the optical element expands in such a way that an expansion of the optical element is not impeded by the mount, whereby a deformation of the optical element can be reduced or even avoided.

The aspect of the invention mentioned second is based on the idea that the temperature control of the optical element helps to create a situation in which deformations of the optical element, in particular during the optical operation of the component, at least do not change, i.e. show no transient effect. It is therefore preferred in particular to heat the optical element before operation approximately to the operating temperature that would be brought about during operation of the optical component by the irradiation with light, in order in this way already to set or prescribe a specific deformation of the optical element, which then however no longer changes, or not substantially, during operation on account of a temperature stabilization and further measures that are preferably provided and still to be described. In this way, transient effects caused by deformations only occurring during operation are at least reduced. Such deliberately set or prescribed deformations of the optical element can be eliminated in their effect on the optical performance by static measures or by adjustment measures, since these deformations do not change, or not substantially, during operation on account of the temperature stabilization.

In preferred embodiments, the at least one holding element is suppliable with a cooling medium.

In particular, the at least one holding element preferably comprises at least one channel for leading the cooling medium through the holding element.

The cooling medium is preferably led through the at least one holding element in a cooling coil forming the at least one cooling channel.

In these embodiments, the at least one holding element is actively cooled by means of a cooling medium, for example water, oil, cooling gas or any other medium which is suited as a cooling medium.

Further, it is preferred if a wall of the at least one holding element in which the at least one channel is present, has an enlarged overlap region overlapping with the at least one optical element.

This measure has the advantage that the heat transfer from the at least one optical element into the at least one holding element is improved.

For further improving the heat transfer from the at least one optical element to the at least one holding element, the wall thickness of the wall of the at least one holding element is preferably thinned at least in the overlap region so that the at least one channel is closely spaced from the optical element by the wall.

In other words, the at least one channel through which the cooling medium is led is arranged in a close distance from the at least one optical element thus improving the heat transfer from the at least one optical element to the at least one holding element.

In a further preferred embodiment, the optical element comprises a substrate wherein the substrate comprises a material which is highly heat-conductive.

A material having a high heat conduction ability is, for example, copper (Cu), while any other heat-conductive material can be used.

Further, in order to improve the heat conduction properties of the substrate, the substrate can comprise completely or partially enlarged or thickened portions.

If the at least one optical element comprises an optically effective layer, this layer preferably comprises a material which is highly heat-conductive.

In a further preferred embodiment, the at least one optical element is connected to the at least one holding element by means of a heat-conductive connecting element or means, for example by a heat-conductive adhesive, by soldering or welding or by a heat-conductive mechanical connection.

For example, an adhesive can be used, which is filled with metal particles.

It is further preferred in this connection, if the connecting element or means is thin compared to its contact area with the at least one optical element and the at least one holding element.

This measure further contributes to an improved heat transfer from the at least one optical element to the at least one holding element. In case that the connecting element or means is an adhesive, the adhesive thickness should be as small as possible, thus providing a small gap between the optical element and the holding element. Similarly, if the at least one optical element and the at least one holding element are soldered or welded to each other, the solder or weld thickness should be as thin as possible. In case of a mechanical connecting element, for example a mechanical clamping provides a direct contact between the at least one optical element and the at least one holding element for an improved heat transfer.

It is further preferred, if the at least one holding element comprises a material which is highly heat-conductive.

This measure is also suited for improving the heat transfer from the at least one optical element to the at least one holding element, in particular for transferring the heat from the at least one optical element to the cooling medium flowing through the at least one holding element as provided in one of the before-mentioned embodiments.

In a further preferred embodiment, the at least one holding element is movable with respect to at least one optical element, and/or the at least one holding element is movable with respect to the carrier structure.

This measure is particularly useful if the at least one optical element and the at least one holding element have different thermal expansion coefficients which normally lead to a different thermal expansion of the optical element with respect to the holding element which can cause deformations of the at least one optical element. By a movable bearing of the at least one holding element, in particular with respect to the carrier structure, different thermal expansions of the at least one optical element and the at least one holding element are made innocuous in terms of stresses or tensions which could deform the at least one optical element.

In order to achieve a movability of the at least one holding element with respect to the carrier structure, the at least one holding element is preferably connected to the carrier structure by means of at least one leaf spring, and/or by means of at least one solid body joint, and/or by means of at least one slide bearing or at least one roller bearing.

In a further preferred embodiment, a heating system is provided for heating up the optical component to a predetermined operating temperature.

This measure has the advantage that the optical component can be rapidly brought onto the operating temperature which would normally arise after a certain period of irradiation of the at least one optical element of the optical component with light.

The heating system preferably is a contactless heating system.

The heating system preferably comprises a heating shield surrounding the optical component.

Further, in case that the at least one holding element is supplied with a cooling medium, the cooling medium preferably can be heated for heating the optical component to the predetermined operating temperature.

In specific embodiments, the at least one optical element is a mirror, and the at least one holding element is a strut or spoke extending between the mirror and the carrier structure.

In this case, the carrying structure preferably is a ring surrounding the at least one mirror, and the strut or spoke extends radially between the at least one mirror and the ring.

In a further preferred embodiment, the optical component comprises a plurality of optical elements in form of connector shells nested in one another, for example in a substantially concentrical arrangement, and wherein a plurality of radially directed spokes or struts form the holding elements and are connected to at least some or each of the shells.

In this context, it is further preferred, if the spokes are connected to a common outer ring and/or a common inner ring.

As already mentioned, the present invention is in particular useful for an optical component which is a collector for use in EUV-lithography.

Further features and advantages will become apparent from the following description and the accompanying drawings.

It is to be understood that the features mentioned above and those yet to be explained below are not only applicable in the combinations given, but also in other combinations or in isolation without departing from the scope of the present invention.

BRIEF DESCRIPTION OF THE DRAWINGS

Some preferred embodiments are shown in the drawings and will be explained hereinafter with reference thereto. In the drawings.

DETAILED DESCRIPTION OF PREFERRED EXEMPLARY EMBODIMENTS

Figure 1A:
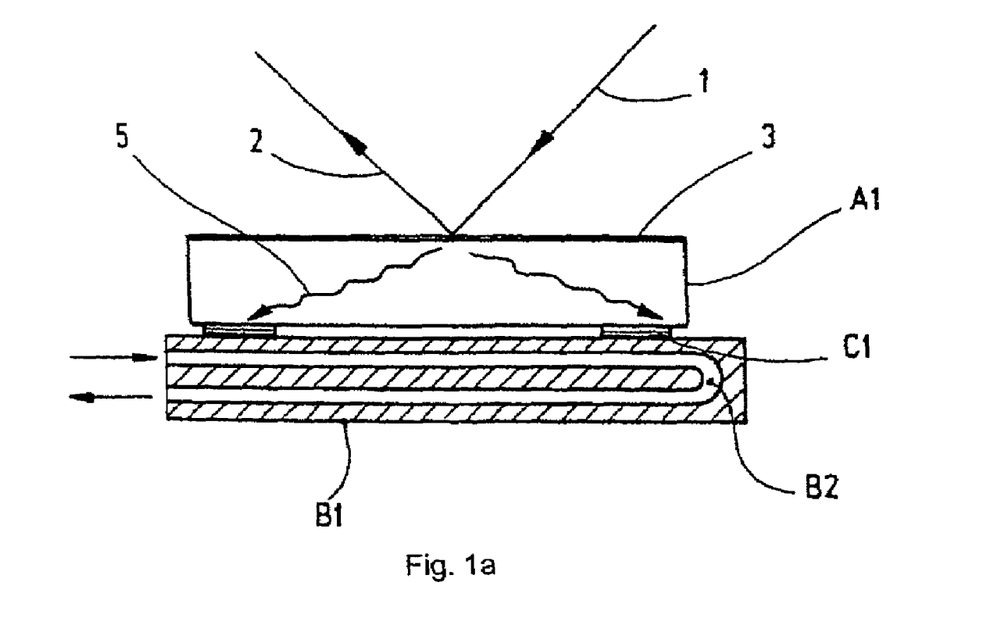

FIG. 1a generally shows an optical component which is comparable with the optical component shown in FIG. 1. Reference numerals used in FIG. 1a which are identical with those reference numerals in FIG. 1 denote same features as in FIG. 1, and they are not described here again.

FIG. 1a generally shows the heat conduction from an optical element A1 of the optical component into the holder or holding element B1 according to the present invention. The optical element of the optical component comprises a substrate A1 made of a highly heat-conductive material (for example copper, aluminum, SiC) and having a large cross-section. The holder B1 comprises one or several cooling channels B2 which is or which are flown through by a cooling medium. The optical element A1 is connected to the holding element B1 by means of a highly heat-conductive connecting element or connecting means C1 which has one or several of the following characteristics: a large contact area for contacting the optical element A1 and the holding element B1, a small thickness, a good heat conduction, and the formation of a small gap between the optical element A1 and the holding element B1. The connecting element or connecting means is, for example, an adhesive filled with metal particles or graphite. Instead of an adhesive, a mechanical clamping mechanism can be used in order to connect the optical element A1 to the holding element B1.

The configuration shown in FIG. 1a offers a good carrying off of heat from the optical element A1 which, thereby, is only slightly heated up. Thermal deformations are reduced due to the reduced heating up.

Figure 2:
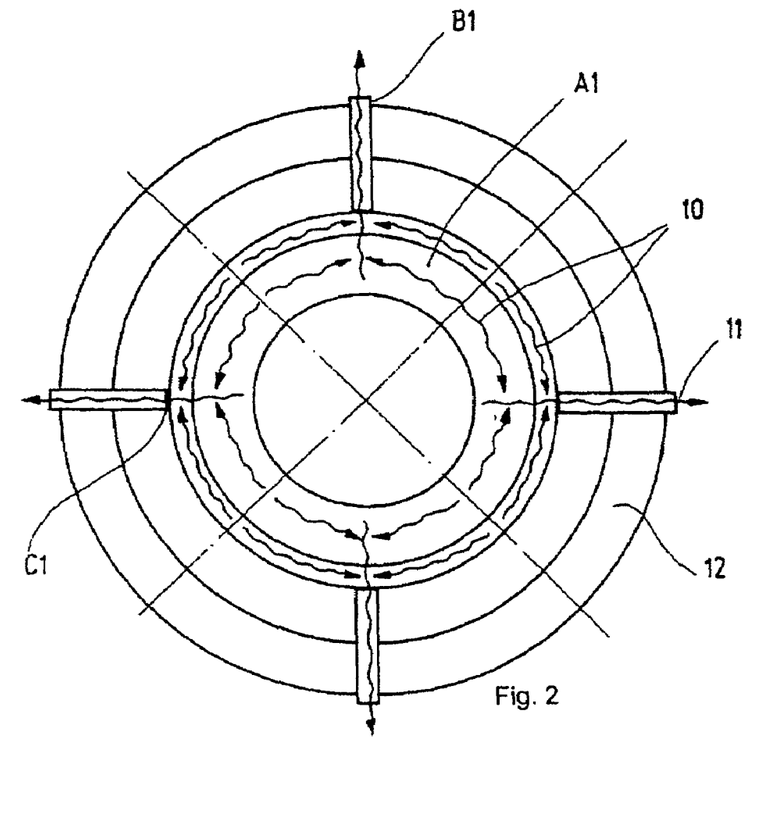
FIG. 2 shows a collector shell of an EUV-collector having cooled holding struts.
Figure 2A:
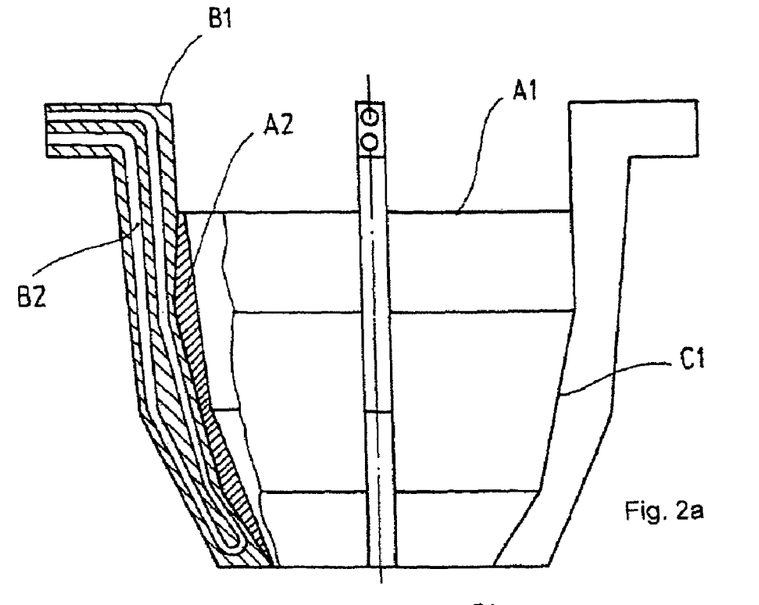

FIG. 2 shows another embodiment of the present invention. FIG. 2 shows an optical component comprising a collector mirror shell A1 as the optical element and, connected thereto, four struts B1 as the holding elements.

Heat 10 absorbed by the collector mirror shell A1 is carried off by the cooled struts B1, as indicated with reference numeral 11. The number of four struts B1 which are arranged at the periphery of the shell A1 is only exemplary, and can be larger or smaller than four. The struts B1 are integrated in an outer ring 12, which serves as carrying structure or holder and which includes fixing elements to a housing or a mounting or a carrier (not shown).

The struts B1 are in contact with the shell A1 by means of connecting elements or means C1, as described in connection with FIG. 1a.

As shown in the upper part of FIG. 2, the struts B1 comprise one or several channels B2 for passing through the cooling medium as already described with respect to FIG. 1a.

It is possible to combine a plurality of shells A1 by fitting same into one another. FIG. 2 only shows the holding element B1 of a single shell A1.

In principle, it is also possible to cool larger surfaces or areas of the optical element A1. For example, the struts B1 which are arranged in the optically not effective region or in the optical shadow region of the optical element A1 could be designed broader, and, if the need arises, could even extend over the entire periphery of the shell A1. Further, cooling channels could also run in azimuthal direction. The advantage of the present concept resides in the simple design of the cooling system, and is, further, founded in the fact that the risk of applying deformations by the integration process (gluing, welding, soldering, clamping etc.) is reduced in the present concept. Azimuthal thermal gradients can be preferably avoided by expanding or thickening the substrate of the shell A1 as indicated by reference numeral A2 and by using a material for the substrate which shows an enhanced heat conduction characteristic.

Figure 3:
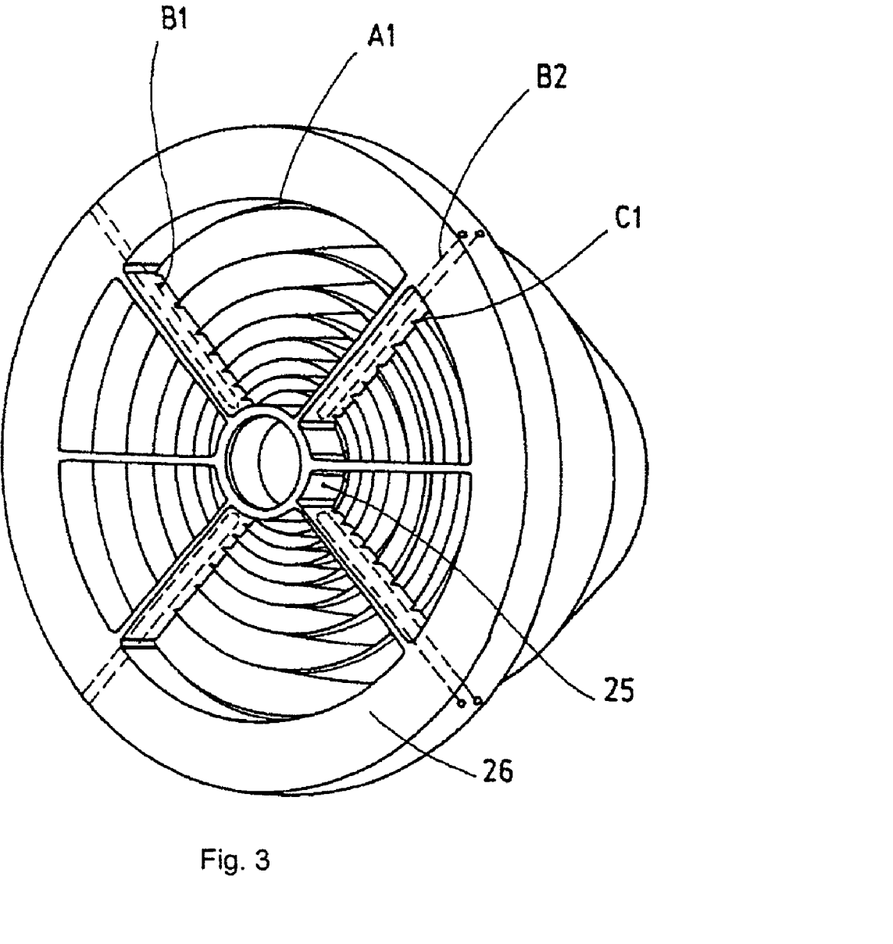
FIG. 3 shows a corresponding EUV-collector having cooled holding spokes.

FIG. 3 shows an optical component in form of an EUV collector comprising a plurality of collector shells A1 which are nested into one another in concentric fashion, and which are glued in a spoke wheel as indicated with reference numeral C1, wherein the spokes B1 of the spoke wheel comprise cooling channels B2, which are flown through by a cooling medium as already described above.

Figure 4:
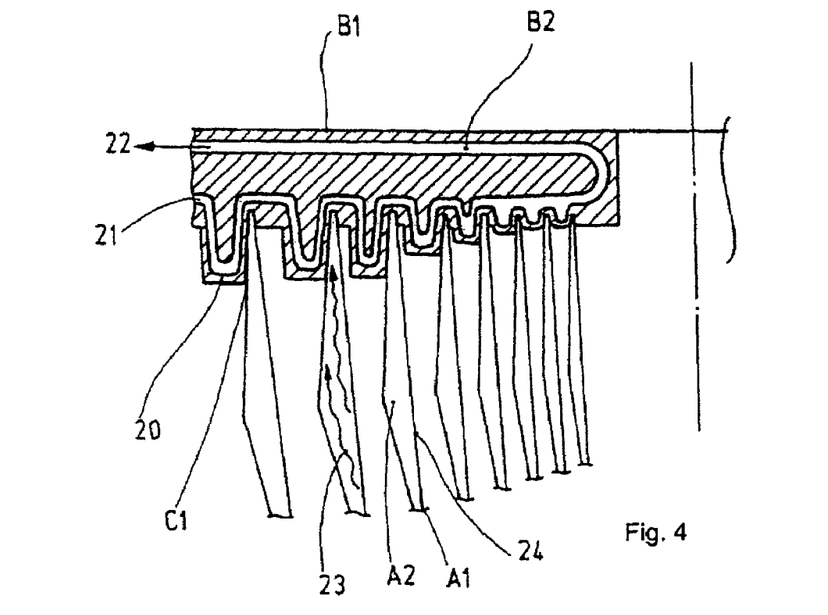
FIG. 4 shows a longitudinal section through a cooled spoke in FIG. 3.

FIG. 4 shows a sectional view through one of the spokes B1.

The amount of heat 23 absorbed in a collector shell A1 at the optical mirror surface 24 is carried off along the collector shell A1 into the cooled strut or spoke B1 of the spoke wheel (confer FIG. 3). Each of the spokes B1 which form the holding elements of this optical component comprises an integrated cooling line or channel B2, in which a cooling medium is supplied 21 and carried off (22) again. The heat transport is supported by a shell material of the collector shells A1 having a good heat conduction property, for example copper, and by thickened or expanded regions A2 of the collector shells A1 in the shadow region of the collector.

The heat transition from each of the shells A1 into the spokes B1 can be further improved by the following preferred structural elements:

an overlap region between the optical shell A1 and the spoke B1 as large as possible and having an area as large as possible which can be made possible by lowering or providing the spokes B1 with protrusions 20;

fixing the shells to the spokes B1 by means of a connecting element or means C1 having a good heat conduction property, for example a heat conducting adhesive;

minimizing the thickness of the connecting elements or means C1, thereby minimizing the gap between the shells A1 and the spokes B1;

as an alternative soldering or welding instead of gluing the shells A1 to the spokes B1;

as another alternative, a mechanical connection of the shells A1 to the spokes B1, for example by clamping, screwing, etc.;

a wall thickness as small as possible of the wall of the spokes B1 in the overlap region between the spokes B1 and the shells A1 so that the shells A1 are closely adjacent to the cooling channels B2 in the spokes B1;

providing the spokes made of a material having a high heat conduction property (for example copper or aluminum); and/or disposing the spokes B1 in an intermediate region between the ends of the shells A1 instead of disposing the spokes B1 at the edge or end of the shells A1 as shown in FIGS. 3 and 4.

By suitably choosing the wall thicknesses A2 of the shells A1, the wall thickness of the spokes B1 in the overlap region or in the region of the separation joint C1 and the cooling channels B2 and of the thickness of the connection element C1, it is possible to achieve that a higher and determinable temperature arises on the collector shells A1. This fact can be used to achieve that the same temperature arises for all shells A1 of the collector within a certain tolerance. A heating of the collector and a change of the shape in connection therewith then can be corrected by suited methods (for example displacing the light source or the collector), because the temperature distribution now is approximately homogenous. The same can be achieved for a collector in FIG. 2 having cooled holding struts, i.e. a homogenous temperature can be achieved in this manner.

Deformations of the shells A1 can occur, in particular in the region of the connecting elements or means C1 where the shells A1 and the spokes B1 are connected to each other, due to different thermal expansion properties of the spokes or the spoke wheel and the collector shells A1. Such deformations can be minimized by bearing the spokes B1 such that they are movable, in particular radially free movable, while they preferably are stiff in other directions than the radial direction.

Figure 5:
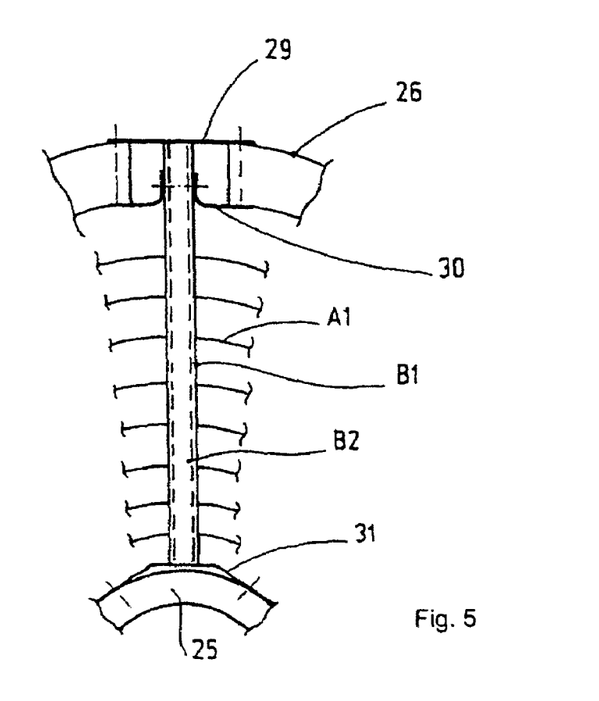
FIG. 5 shows another embodiment modified with respect to the embodiments shown in FIGS. 2-4.
Figure 6:
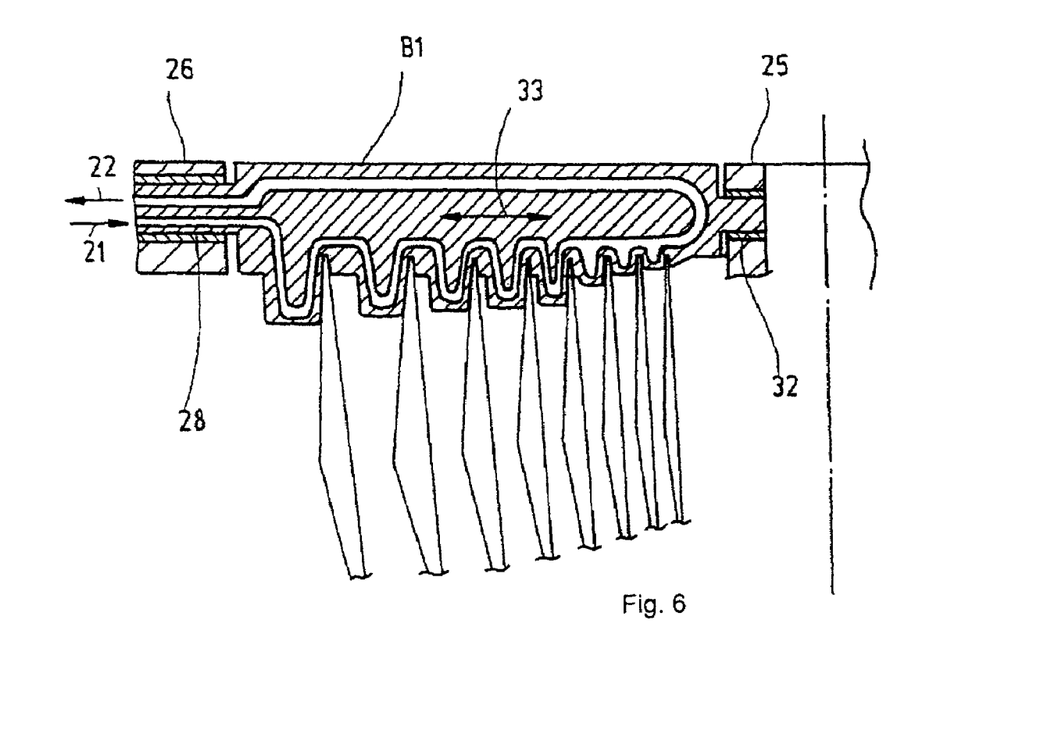
FIG. 6 shows another embodiment modified with respect to the embodiment shown in FIG. 5.

FIGS. 5 and 6 show two variants for such a movability.

FIG. 5 shows a solution comprising leaf springs. To this end, those spokes B1, in which a cooling system B2 is integrated, are fixed to an outer ring 26 of the spoke wheel via leaf springs 29, 30. Such a spoke B1 is also fixed to an inner ring 25 via a leaf spring 31.

As an alternative, the spoke wheel could be produced monolithically with integrated solid body joints, or, instead of leaf springs, small single elements with solid body joints could be used.

FIG. 6 shows a solution having a slide bearing. Those spokes B1, which are flown through by a cooling medium 21, 22, are mounted in bearings in the spoke wheel 25, 26 by means of two slide bearings 28, 32. When the collector shells A1 expand, the spokes can move radially 33 together with the collector shells A1.

The slide bearings could be omitted. As an alternative to the described solution having bolts and bores, the spokes B1 could also be connected to the fixed parts 25, 26 of the spoke wheel by means of a pin and could slide on the pin.

Roller body-linear-guidings could also be used instead the slide bearings 28, 32.

In the following, manufacturing methods for manufacturing the EUV-collector shells A1 for the present invention are described.

The shells A1 can be manufactured from a highly heat-conductive material (for example copper) by electroforming. In this con-junction, it is also possible to locally thicken (A2 in FIG. 4) the shells A1 by means of a suited masking during the manufacturing process so that the shadow regions of the collector are optimally filled up for the purpose of an improved heat conduction. Even in those cases where the shells are made of a material having a lower heat conduction coefficient (for example nickel), the thickening of the shells A1 results in a considerably improved heat carrying off from the shells A1.

In some cases, thermal gradients and deformations of the optics produced by the thermal gradients cannot be completely removed even if the cooling concept used is the best available. In any case, an operating temperature will arise in a steady state which is higher than the initial temperature of the system. A further improvement, therefore, is the use of an additional heating system. The optical elements should be rapidly heated up to the operation temperature, and the temperature of the optical component (for example of the EUV-collector shells) should be kept constant subsequently, by reducing the heating power of the additional heating slowly, so that, in the steady state, the optical component is completely heated by the absorbed power of the actual illumination.

The transient effect of the system during operation (change of temperature and, thus, deformations and optical performance) are still further minimized in this manner.

This system requires a temperature control, wherein the temperature at the optical component can be permanently measured by means of a temperature sensor applied thereto, and the heating power of the additional heating is controlled, accordingly. Only if the optical component has achieved the operation temperature by means of the additional heating, the system is ready for operation. This requires that a certain time of heating up is allowed, before the system is switched on or is ready for operation.

Figure 7:
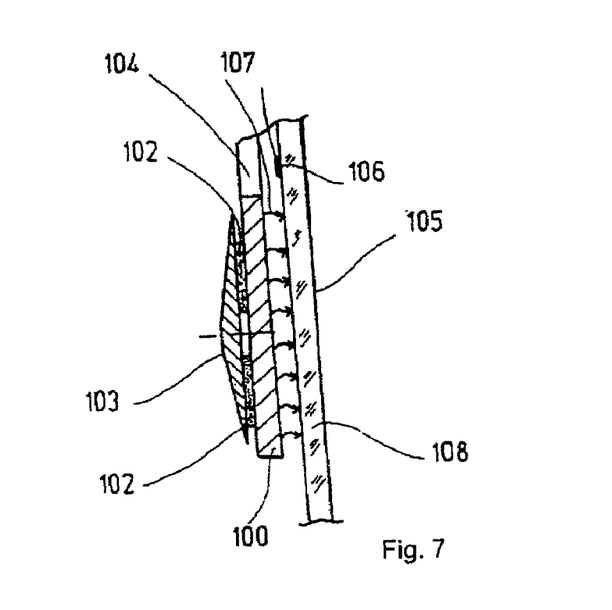
FIG. 7 shows still another embodiment of the invention, wherein a heating system is additionally provided for the optical component.

A contactless concept for such an additional heating is preferred, so that deformations of the optical element of the optical component due to the application of heating elements can be avoided—confer FIG. 7. In principle, heating shields can be used arranged around or surrounding the shells A1, which apply the heating power onto the optical parts 108 by means of radiation 107. Such heating shields can comprise a carrying body 101, heating foils (or heating mats) 102, several plates 103 for pressing and a carrying frame 104 (confer FIG. 4). The carrying frame and the heating shields are situated in the not used shadow regions of the optical component. The optically usable region or surface is situated on another site 105 of the optical component. Some temperature sensors 106 are also applied onto the optical parts of the optical component, in order to measure the temperature to be adjusted.

In case that the heating elements cannot be arranged around the entire optical components for the reason of space requirements, it is advantageous if the substrate 108 comprises a highly heat-conductive material (for example copper) and is optimally thickened up as described above.

As an alternative, the heating shields could also include a heating spiral or induction coils. The solution having heating foils/-mats, however, offers a very flat and space-saving solution which includes commercially available heating elements.

In case that a minimum temperature is required, which is higher than the initial temperature in the switched-off state, this minimum temperature is reached only after a certain time period in a normal operation. The system can be more rapidly preheated to the operation temperature by means of an additional heating. This temperature can be necessary for the operation or for any service or cleaning cycles.

Furthermore, an additional heating system can be provided for achieving a required system temperature. Such a heating can be configured as described before. It is also conceivable that the cooling medium as described above is heated up via a heat exchanger and, thus, heats up the system. It is also conceivable that the temperature of the cooling medium can be controlled between hot and cold. As an alternative, the hot medium could be lead through the channels of the cooling system for the purpose of heating up, while, in the normal operation, it is then switched over to a cool medium for cooling. In this case, the hot and the cool medium should be the same, for example oil or water, the boiling point of which is far beyond 100° C. in an overpressure condition.

Figure 8:
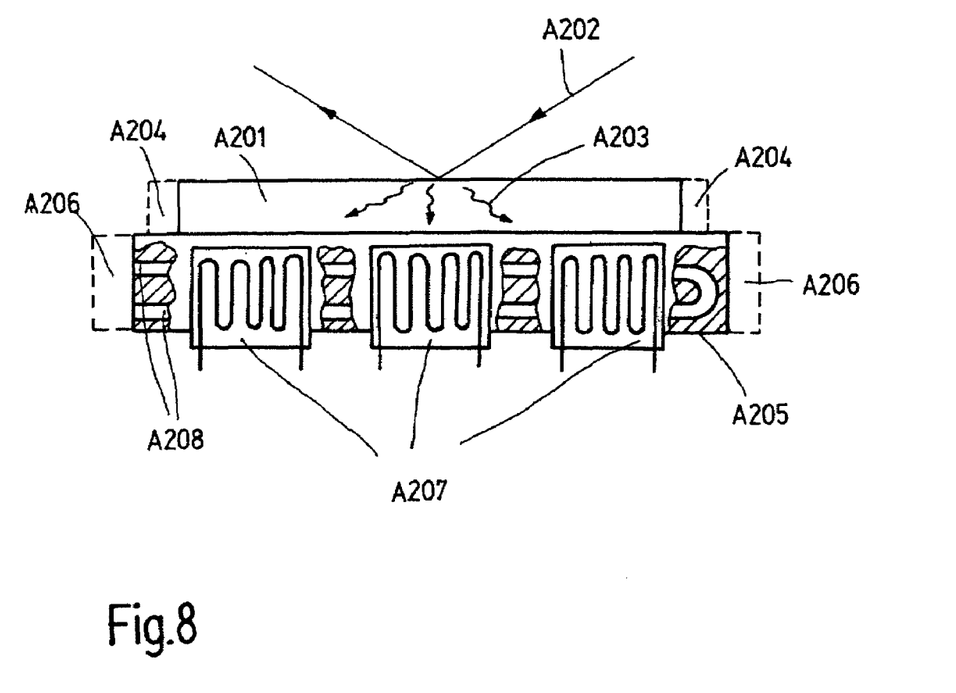
FIG. 8 shows a schematic representation of another exemplary embodiment of an optical component.

FIG. 8 shows schematically and in principle an arbitrary optical component, which has an optical element A201 and a mount A205.

The optical element A201 is heated by irradiation with light A202, as indicated by A203, and expands, as is illustrated by portions A204 in broken lines. This expansion of the optical element A201 is impeded by the mount A205, since without special measures it does not expand to the same extent as the optical element, as a result of which the optical element A201 is deformed. This deformation changes during operation, since the introduction of heat to the optical element A201 and to the mount A205 changes. Consequently, the optical performance of the system also changes.

According to the invention, the various measures to be described below are then taken, contributing to reducing deformations of the optical element A201, in order in this way to improve the optical performance of the optical component or of the optical element A201. In this case, the change over time of the deformation of the optical element A201, and consequently the change over time of the optical performance of the system, is also to be kept low.

One measure is to bring the (outer) mount A205 of the optical element A201 to a specific, optimum temperature $T_{F,opt}$, referred to hereafter as the "optimum mount temperature", and to control this temperature $T_{F,opt}$ by open-loop or closed-loop control. At this optimum mount temperature, the mount A205 expands in such a way, as indicated in FIG. 8 by the portions A6 in broken lines, that the deformation of the optical element is at its least. In other words, setting the optimum mount temperature achieves the effect that the mount A205 does not impede the heating-induced expansion A204 of the optical element A201, as a result of which a deformation of the optical element A201 caused by stresses can be reduced.

The optimum mount temperature is chosen in dependence on the resultant temperature of the optical element A201 and the coefficient of expansion of the substrate of the optical element A201 and/or the coefficient of expansion of the mount material of the mount A205.

A mount material with a low coefficient of expansion has a high optimum mount temperature, which results in the mount A205 having to be brought to a higher temperature in order for it not to hinder the expansion of the optical element A201 during operation. In a corresponding way, a mount material of the mount A205 with a low coefficient of expansion has a low optimum mount temperature.

Depending on the level of the required optimum mount temperature, the temperature control device for the mount A205 may have a heating system A207 or a cooling system A208 or both a heating system A207 and a cooling system A208, which is, or are, respectively assigned to the mount A205. The heating system A207 and/or the cooling system A208 may have a number of heating or cooling elements, which are provided on the mount A205 or are connected to it.

If the optimum mount temperature is higher than the highest mount temperature that would be produced by all the heat sources of the system, but without additional heating of the mount A205, at any point in time over the entire operating period, a heating system for the mount A205 which controls the optimum mount temperature by changing the heating output is sufficient. In this case, a cooling system is not necessary for the mount A205.

If the optimum mount temperature is lower than the lowest mount temperature that would be produced by all the heat sinks of the system, but without additional cooling of the mount A205, at any point in time over the entire operating period, a cooling system for the mount A205 which controls the optimum mount temperature by changing the cooling output is sufficient. In this case, a heating system is not necessary for the mount A205.

A closed-loop control of the mount temperature T such as that described above is all the easier the greater the tolerance of the optimum mount temperature $T_{F,opt}$.

The optimum mount temperature has all the greater tolerance, and consequently can be set or controlled with less effort and is less sensitive to temperature gradients, the lower the coefficient of expansion of the material of the outer mount A205.

Therefore, a material such as Invar or similar nickel alloys such as Ni42 (1.3917), Ni43 (1.3918) or Ni48 (1.3920) is preferably used for the mount A205. The use of Zerodur as a material for the mount A205 is also conceivable, but not always desired, since a coefficient of expansion of a few ppm/K (Kelvin) is advantageous to allow a desired expansion of the mount A205 to be set by means of the associated optimum temperature.

In many application cases, the least possible and greatest possible mount temperature that would be produced by all the heat sources and sinks of the optical component at any point in time over the entire operating period lie within the tolerance of the optimum mount temperature. In this case, it is possible to dispense both with a heating system A207 and with a cooling system A208 of the outer mount A205.

If, on the other hand, the tolerance of the optimum mount temperature is small, temperature gradients in the outer mount A205 can also make the optical performance not conform to the required specification. Temperature gradients of the mount A205 can be reduced by providing a number of heating elements A207 or cooling elements A208, or both, which are locally distributed, that is to say locally assigned to the mount A205, and it being possible for the performance of the latter to be set variously.

Temperature gradients in the mount A205 and slight deviations from the optimum mount temperature bring about changes in deformation in the optical components, and consequently changes in the optical performance of the system. Such system weaknesses can be reduced by flexible mount elements, such as leaf springs, solid-state joints or guiding elements between the mount A205 and the optical element A201 or, in a case where the mount A205 is formed by an outer mount and an inner mount A211, between the outer mount and the inner mount. In other words, the tolerance of the optimum mount temperature can be increased by such flexible mounting elements, and consequently the temperature control of the outer mount A205 can be simplified.

Figure 9:
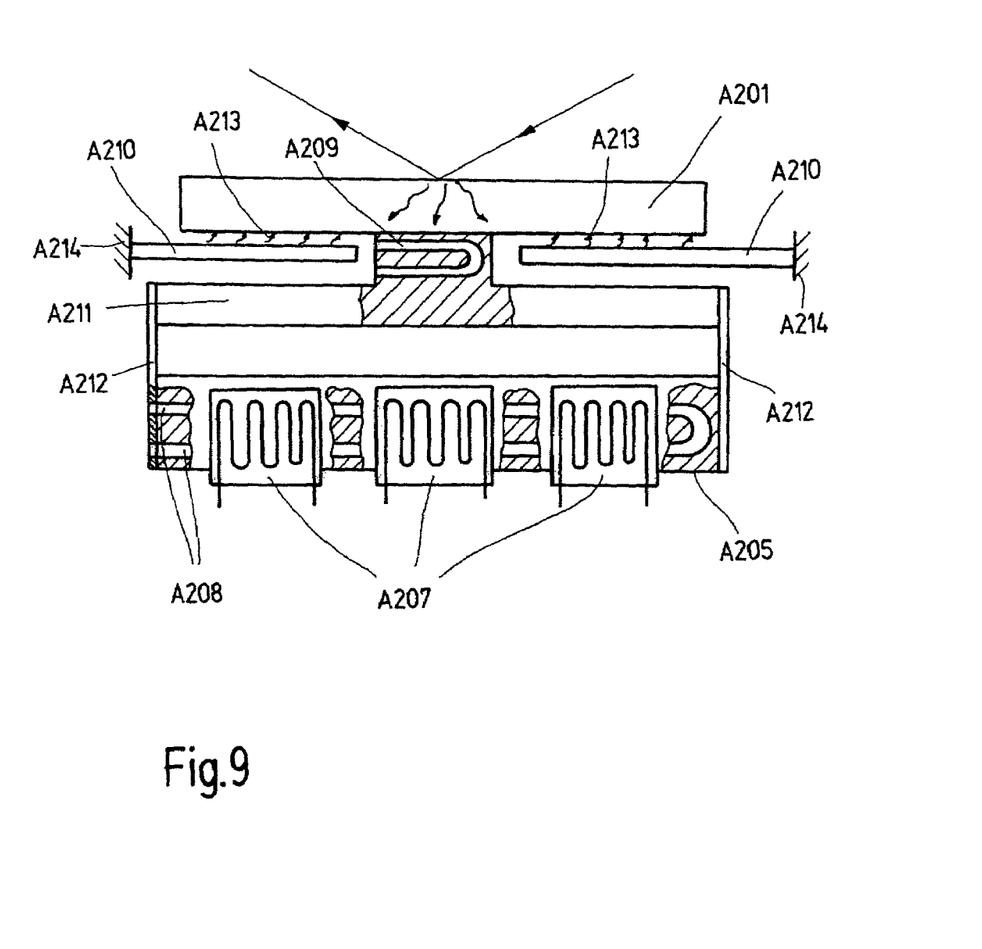
FIG. 9 shows a further exemplary embodiment of an optical component.

Further aspects of the invention are now described with reference to FIG. 9. The component in FIG. 9 is modified in comparison with the component in FIG. 8, the same or comparable parts of the component in FIGS. 8 and 9 being provided with the same reference numerals.

Apart from the deformations of the optical element A201 occurring in the final thermal steady state of the optical component, the transient changes in deformation, and consequently the resultant changes of the optical performance during operation, are also important for the operation of the optical component. The previously described precautions also contribute to the reduction of these transient effects. In addition to the temperature stabilization of the outer mount A205, however, the temperature stabilization of the optical component A201 itself is also of significance for minimizing these transient effects.

This temperature stabilization of the optical element A201 may take place by means of a temperature control device for the optical element A201 which has a cooling system A209 and/or a heating system A210 for the optical element A201.

A cooling system A209 of the optical element A201 is possible in addition to the temperature stabilizing measures on the outer mount A205, in that the cooling of the optical element A201 is integrated in an inner intermediate mount A211 of the mount A205. The outer, temperature-controlled mount A205 reduces the remaining, resultant deformations of the optical element A201 and also the resultant changes in deformation of the optical element A201.

The connection of the outer mount A205 and of the inner, cooled mount A211 preferably takes place by means of flexible elements A212, for example solid-state joints or leaf springs, which ensure that the inner mount A211 and the outer mount A205 are decoupled thermally and also largely mechanically in terms of stress.

As an alternative to the solid-state joints or leaf springs, guiding elements are also conceivable.

Also a heating system A210 for the optical element A201 is preferred, in addition to the measures described. The heating system A210 may be formed in particular as a radiant heating system and preheat the optical element A201 by means of a radiation A213, in order to prescribe the deformations of the optical element A201 at the beginning of the system process, for example at the beginning of a lithography process. In other words, deformations are induced by heating the optical element A201 before the beginning of the system process, but these deformations then do not change any longer, or not substantially, during the system process. At the beginning of the system process, the heating system A210 is switched off or operated further with lower output. The change over time of the deformation, and consequently the change of the optical performance of the system, is significantly reduced by such preheating of the optical element A201.

If the desired performance of the optical system changes, for example is reduced, during operation, for example due to reduction of the intensity of the light, the design parameters for the provision of the optimum mount temperature then change. In this case, the heating system A210 can be used for heating up the optical element in such a way that an identical, or virtually identical, state of the optical system as existed before the reduction in the performance of the system is set.

In order that such a heating system A210 has no influence, or at least only a minor influence, on the steady-state and transient deformation of the optical element A201, the following measures are optionally and preferably to be provided: the heating output is applied to the optical element A201 by means of the radiation A213. The heating system or the heating plates A210 are thermally and mechanically decoupled from the supporting structure (mounting portions A205 and A211) of the optical element A201, as described later with reference to the further FIGS. 10 to 12. It may only be required to preheat only those regions of the optical element A201 that have the greatest influence on the deformation.

Figure 12:
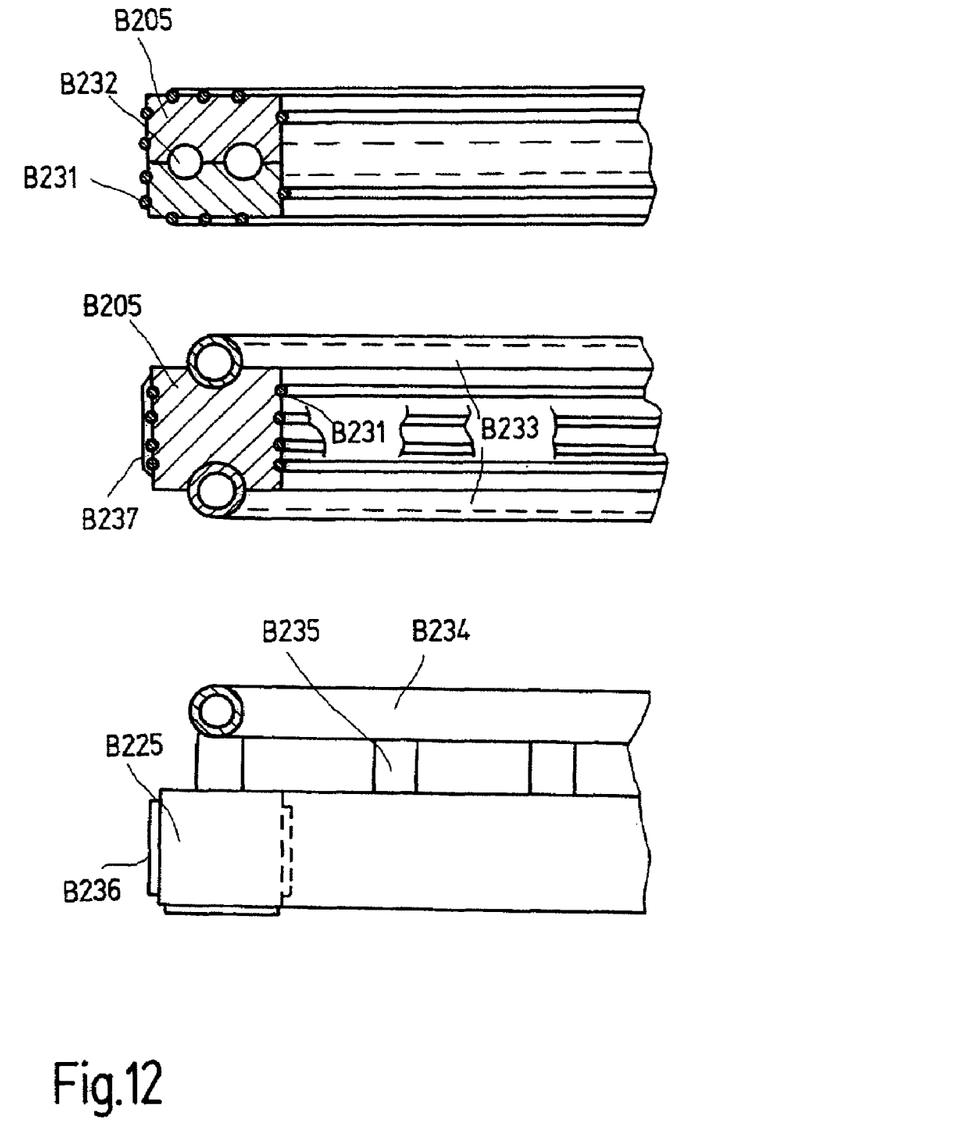
FIG. 12 shows a further exemplary embodiment for a modification of details of the collector in FIG. 10 or 11.

If the supporting structure A214 of the heating system A210 is not completely decoupled from the mount A205 of the optical element A201, the deformations and the changes in deformation of the optical element A201 during operation can be reduced by controlling the temperature of the supporting structure A214 or B225 in FIG. 12 of the heating system A210. For this purpose, preferably a heating system or a cooling system of the supporting structure A214 or B225 or a heating system and a cooling system for the supporting structure A214 or B225 of the heating system A210 is provided.

In spite of a preheating A213 and best possible cooling A209 of the optical element A201, changes of temperature over time and consequently changes of the deformation of the optical element A201 occur during operation when optical elements are subjected to high thermal loading.

These transient effects are already corrected by the aforementioned measures in such a way that most optical components still conform with their specification. An additional improvement can be achieved by the temperature of the outer mount A205 not being controlled to a specific, optimum temperature, but being correspondingly changed by analogy with the change in the temperature of the optical element A201 by means of a cooling system A208 and a heating system A207 of the outer mount A205.

The fastening of the entire optical component in the higher-level system supporting structure (not represented) has an influence on the deformations of the optical element A201. These deformations and changes in deformation can be minimized by using guiding elements such as rollers or sliding bearings as fastening elements, and by fastening the optical component with the optical element A201 and the mount A205 or A211 on the system supporting structure by means of leaf springs or other fastening elements with solid-state joints. These described fastening elements are movable in the direction of expansion of the optical element. Such fastening elements should, moreover, be thermally insulating in the best possible way, in order to avoid thermal gradients of the mount A205 as far as possible.

Also in the case of cooling of specific elements of the optical component, as described above, cooling water feed and discharge pipework that has flexible feed lines should be provided, for example corrugated hoses or bellows, in order to avoid deformations of the optical element A1 caused by the cooling water feed and discharge pipework.

Further exemplary embodiments which relate to a collector for EUV lithography are described with reference to FIGS. 10 to 12.

Figure 10:
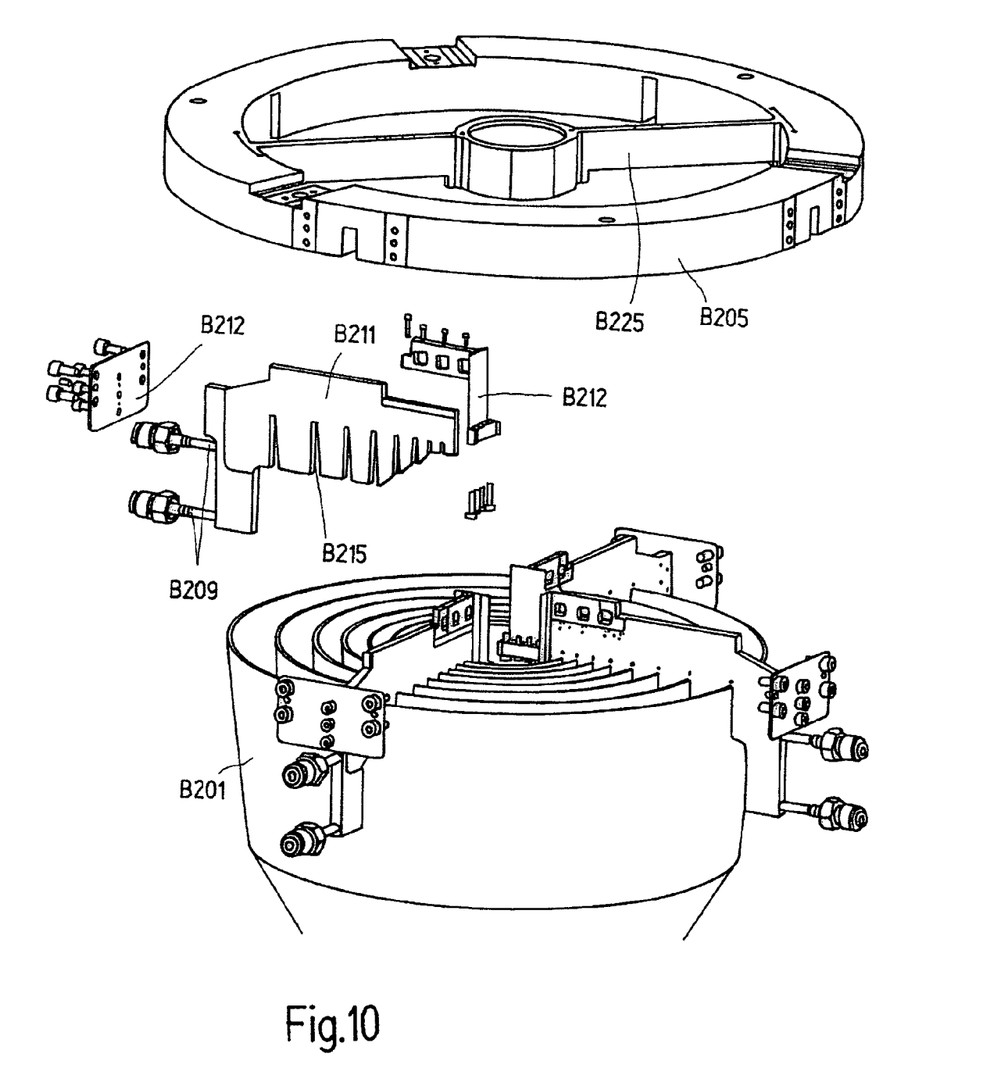
FIG. 10 shows a collector for EUV lithography in an exploded representation.

In FIG. 10, such a collector for EUV lithography is shown in an exploded representation.

In the exemplary embodiment shown, the collector comprises 8 mirror shells B201, nested one in the other, and a spoked wheel, which is formed by a spoked-wheel supporting body B205, four spokes B211 and leaf-spring elements B212, which flexibly connect the spokes B211 to the supporting body B205. The mirror shells B201 are integrated in the spoked wheel.

The spoked-wheel supporting body B205 corresponds to the outer mount A205 of the exemplary embodiments according to FIGS. 8 and 9, and the spokes B211 correspond to the inner or intermediate mount A211.

The mirror shells B201 are inserted and integrated in slots B215 of the spokes B211, for example bonded in, soldered in, welded in, clamped or connected to them in some other way.

During the EUV lithography operation, the mirror shells B201 heat up and expand. This thermal energy is dissipated to the spokes B211, in which a cooling system B209 is integrated. A higher temperature of the mirror shells B201 occurs, deforming the mirror shells B201. This deformation of each mirror shell B201 can be prescribed by heating up the mirror shell B201 by means of a heating plate B221, B222 before the EUV lithography process begins.

At the beginning of the EUV lithography process, in which the EUV source is switched on and the collector heats up, the additional heating system B221 is switched off. In this way, the deformation of the mirror shells B201 is kept largely constant during the EUV lithography process.

The heating plates B221, B222 (FIG. 11) may be designed in such a way that they heat up the optical element, i.e. the mirror shells B211, contactlessly by means of radiation. Alternatively, such a heating plate may be formed by an insulated heating wire, which is wound rotationally symmetrically or in some other way, an insulated heating wire B221, which is soldered onto thin rotationally symmetrical metal sheets, one or more heating mats or heating foils, which are screwed, clamped, riveted or otherwise fastened onto thin supporting bodies, a heating coil around the mirror shells B201 or an induction or eddy-current heating system around the mirror shells B201.

The heating wires B221 may be bifilar-wound, as indicated by B223, in order that the winding also does not produce any inductance in the form of a coil.

Supporting rods B224 are fastened to the non-cooled spokes B225 of the spoked wheel B205. In order that the heating plates do not have any influence on the steady-state and transient deformation behavior of the optical elements in the form of the mirror shells B201, the heating plates B221, B222 must be mechanically and thermally decoupled from the collector. Such thermal coupling can be realized by the supporting rods B224 being formed from a material with poor heat conduction, for example high-grade steel, ceramic etc., the heating plates B221, B222 being fastened with the aid of insulating disks, for example made of ceramic or some other material with poor heat conduction, the elements of the supporting structure B225 being formed from a material with poor heat conduction and heat barriers being provided inside the supporting structure B225, or by means of heat barriers, for example slots, within the supporting rods B224 of the heating plate B221, B222.

Since the heating plates B221, B222 must be very hot, usually above 500° C., to be able to heat up the mirror shells B201 by means of thermal radiation, they expand extremely and could consequently deform the mount in the form of the spoked wheel B205 of the optical elements in the form of the mirror shells B201 via the supporting rods B224. Therefore, apart from the thermal stress decoupling, mechanical stress decoupling of the heating plates B221, B222 is also necessary, in order to prevent additional steady-state and transient deformations of the mount in the form of the spoked wheel B205, and consequently of the optical elements in the form of the mirror shells B201.

Such stress decoupling of the heating plates B221, B222 may be realized by a flexible link of the supporting rods B224 to the heating plate B221, for example by means of slots in the heating plate B226 or leaf springs or other solid-state joints, slots or solid-state joints within the supporting rods B224, slots or solid-state joints within the supporting structure B225, or by fastening of the supporting rods B224 to the supporting structure B225 in such a way that the supporting rods B224 can move radially freely during the expansion of the heating plate B221, B222, for example by means of guiding elements between the supporting rods B224 and the supporting structure B225.

Figure 11:
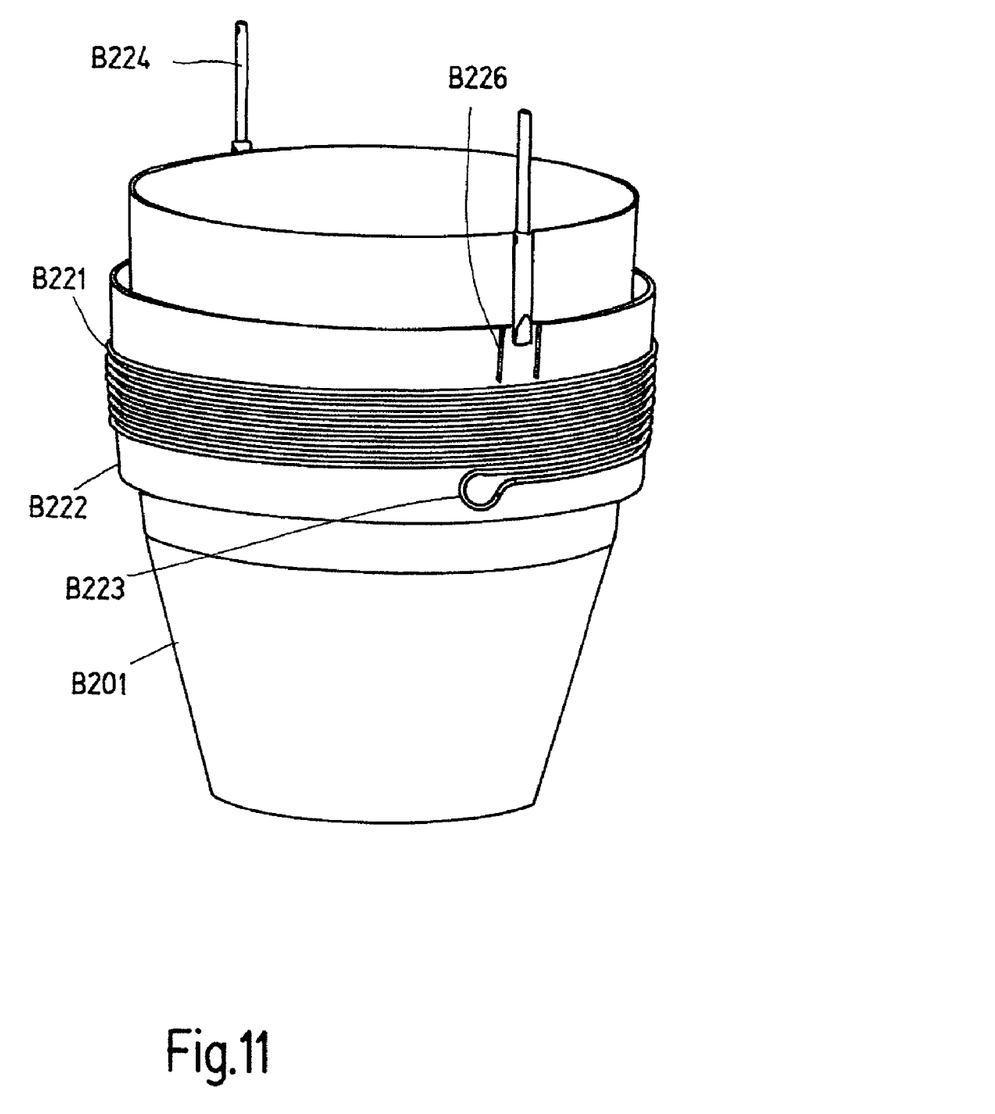
FIG. 11 shows further details of the collector in FIG. 10.

It may be that the entire optical area of the mirror shells B201 need not be preheated; it is adequate to heat up the regions that are critical for deformation (cf. FIG. 11).

Best possible thermal and mechanical decoupling of the heating plates B221, B222 consists in not connecting the supporting structure B225 to the collector mount in the form of the spoked wheel B205. If this is not possible, however, the supporting structure B225 can also be controlled to a specific temperature by heating or cooling elements or heating and cooling elements, in order to reduce the steady-state and transient deformations of the optical elements in the form of the mirror shells B201. Such heating and cooling elements for the supporting structure B225 may be designed like the heating and cooling elements for the outer mount B205, which is described hereafter with reference to FIG. 12.

The following measures may be provided as cooling of the outer mount in the form of the spoked wheel B205, to be precise division of the mount B205 into two, introduction of cooling channels B232 and joining of the divided-in-two mount B205 tightly together, for example by welding, soldering, adhesive bonding or other methods, placement of cooling pipes B233 on the mount B205 and thermal and mechanical connection by means of soldering, welding, adhesive bonding, clamping or other methods, or provision of a cooling pipe B234, which is led along the mount in the form of the spoked wheel B205 and realization of the thermal contact by means of Peltier elements B235 or heating pipes or other heat-conducting intermediate elements. The use of Peltier elements allows electronic control of the cooling output. The use of a number of Peltier elements B235 allows cooling outputs to be dynamically set locally at a number of points, in order to minimize locally and temporally temperature gradients on the mount in the form of the spoked wheel B205.

In the aforementioned cooling channels or pipes, cooling fluid, for example water or cooled gas, is carried. The cooling output is influenced by means of the amount of cooling medium or by means of the temperature of the cooling medium.

For heating the mount in the form of the spoked wheel B205, the following methods may be chosen alternatively or in combination, that is provision of an insulated heating wire B231 on one or more sides of the spoked wheel B5 and soldering in, welding, clamping B237, adhesive bonding or otherwise fastening of the same, provision of heating foils or heating mats B236 on the mount B205 and clamping, screwing, riveting or otherwise fastening the same, heating of the mount B205 by means of radiation, heating of the mount B205 by means of a heating medium in the pipes B233, B234, or cooling channels B232, or by induction or eddy-current heating of the mount B205.

For minimizing temperature gradients on the mount B205, it is possible for a number of heating and cooling elements that can be set variously in their output to be provided on said mount.

It is to be understood that the present invention is not restricted to the embodiments described above. Further, any modifications of the embodiments, in particular combinations of the features of different embodiments can be envisaged without departing from the scope of the invention.

What is claimed is:

1. An optical component, comprising at least one optically effective optical element which heats up when irradiated with light, and at least one holding element for the at least one optical element for holding the at least one optical element in a carrier structure, wherein the at least one optical element is connected to the at least one holding element in heat conducting fashion, wherein the at least one holding element is at least partially provided with an active cooling system for carrying off heat from the at least one optical element;

wherein the at least one optical element comprises a plurality of optical elements in the form of collector shells nested in one another, and;

wherein the at least one holding element is movable with respect to the carrier structure and comprises at least one radially directed spoke that is connected to at least some of the collector shells.

2. The optical component of claim 1, wherein the at least one holding element is suppliable with a cooling medium.

3. The optical component of claim 2, wherein the at least one holding element comprises at least one channel for leading the cooling medium through the holding element.

4. The optical component of claim 3, wherein a wall of the at least one holding element in which the at least one channel is present, has an enlarged overlap region overlapping with the at least one optical element.

5. The optical component of claim 4, wherein the wall thickness of the wall of the at least one holding element is thinned at least in the overlap region so that the at least one channel is closely spaced from the optical element by the wall.

6. The optical component of claim 1, wherein the at least one optical element comprises a substrate, wherein the substrate comprises a material which is highly heat conductive.

7. The optical component of claim 1, wherein the at least one optical element comprises an optically effective layer, wherein the layer comprises a material which is highly heat conductive.

8. The optical component of claim 1, wherein the at least one optical element is connected to the at least one holding element by means of a heat conductive connecting element or means comprising a heat conductive adhesive, by soldering or welding or a heat conductive mechanical connection.

9. The optical component of claim 8, wherein the connecting element or means is thin compared to its contact area with the at least one optical element and the at least one holding element.

10. The optical component of claim 1, wherein the at least one holding element comprises a material which is highly heat conductive.

11. The optical component of claim 1, wherein the at least one holding element is movable with respect to the at least one optical element.

12. The optical component of claim 1, wherein the at least one holding element is connected to the carrier structure by means of at least one leaf spring.

13. The optical component of claim 1, wherein the at least one holding element is connected to the carrier structure by means of at least one solid body joint.

14. The optical component of claim 1, wherein the at least one holding element is connected to the carrier structure by means of at least one slide bearing or at least one roller bearing.

15. The optical component of claim 1, wherein a heating system is provided for heating up the optical component to a predetermined operating temperature.

16. The optical component of claim 15, wherein the heating system is a contactless heating system.

17. The optical component of claim 15, wherein the heating system comprises a heating shield surrounding the optical component.

18. The optical component of claim 1, wherein the at least one holding element is suppliable with a cooling medium, and wherein the cooling medium can be heated for heating the optical component to a predetermined operating temperature.

19. The optical component of claim 1, wherein the spokes are connected to at least one of a common outer ring and a common inner ring.

20. The optical component of claim 1, wherein it is a collector for use in EUV lithography.

* * * * *